United States Patent
Gebre-Selassie et al.

(10) Patent No.: US 8,988,122 B2
(45) Date of Patent: Mar. 24, 2015

(54) APPARATUS AND METHOD FOR PERFORMING SPREAD-SPECTRUM CLOCK CONTROL

(75) Inventors: Ewunnet Gebre-Selassie, San Jose, CA (US); Dawson W. Kesling, Davis, CA (US); Steven J. Kirch, Pleasanton, CA (US); Rahul D. Limaye, Pleasanton, CA (US); Shah M. Musa, Cupertino, CA (US); Fugao Wang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/007,538

(22) PCT Filed: Sep. 30, 2011

(86) PCT No.: PCT/US2011/054395
§ 371 (c)(1),
(2), (4) Date: Sep. 25, 2013

(87) PCT Pub. No.: WO2013/048478
PCT Pub. Date: Apr. 4, 2013

(65) Prior Publication Data
US 2014/0015578 A1    Jan. 16, 2014

(51) Int. Cl.
*H03L 7/06* (2006.01)
*H03L 7/08* (2006.01)
*H04B 1/7085* (2011.01)

(52) U.S. Cl.
CPC .. *H03L 7/08* (2013.01); *H03L 7/06* (2013.01); *H04B 1/7085* (2013.01)
USPC .......................................... 327/157; 327/148

(58) Field of Classification Search
USPC .................................................. 327/148, 157
See application file for complete search history.

(56) References Cited

U.S. PATENT DOCUMENTS

| | | | | |
|---|---|---|---|---|
| 4,250,525 A | * | 2/1981 | Steckler et al. | 348/545 |
| 5,233,314 A | * | 8/1993 | McDermott et al. | 331/17 |
| 6,057,739 A | | 5/2000 | Crowley et al. | |
| 6,362,670 B1 | * | 3/2002 | Beaulieu | 327/156 |
| 6,489,852 B1 | * | 12/2002 | Beaulieu | 331/25 |
| 7,176,738 B1 | * | 2/2007 | Hwang et al. | 327/291 |
| 7,274,232 B2 | * | 9/2007 | Lin et al. | 327/158 |
| 7,388,407 B2 | * | 6/2008 | Lin et al. | 327/262 |
| 7,558,311 B2 | * | 7/2009 | Shin et al. | 375/130 |

(Continued)

FOREIGN PATENT DOCUMENTS

WO    WO 2012/087599    6/2012

OTHER PUBLICATIONS

International Search Report dated Apr. 17, 2012 for corresponding Application No. PCT/US2011/054395.

*Primary Examiner* — Adam Houston
(74) *Attorney, Agent, or Firm* — KED & Associates

(57) ABSTRACT

A terminal includes control logic to control a phase-locked loop to output a spread-spectrum clocking signal. The control logic controls the generation of the spread-spectrum clocking signal by adjusting at least one parameter of the phase-locked loop. The parameter may be a charge pump setting or a loop-filter capacitance of the phase-locked loop, or their digital equivalents. Adjustment of the parameter reduces a predetermined portion of a communications spectrum. The predetermined portion may be located within a range of frequencies allocated to a specific channel, and reduction of the spectrum in this range may serve to reduce noise associated with clocking harmonics.

26 Claims, 8 Drawing Sheets

(56) References Cited

U.S. PATENT DOCUMENTS

| | | | |
|---|---|---|---|
| 7,737,743 B1* | 6/2010 | Gao et al. | 327/158 |
| 8,610,473 B2* | 12/2013 | Abbasi et al. | 327/156 |
| 2003/0039330 A1* | 2/2003 | Castiglione et al. | 375/376 |
| 2006/0098714 A1* | 5/2006 | Shin et al. | 375/130 |
| 2006/0208779 A1* | 9/2006 | Lin et al. | 327/158 |
| 2008/0265958 A1 | 10/2008 | Beaulaton et al. | |
| 2009/0128201 A1* | 5/2009 | Chen et al. | 327/149 |
| 2009/0296869 A1* | 12/2009 | Chao et al. | 375/376 |
| 2010/0127739 A1* | 5/2010 | Ebuchi et al. | 327/148 |
| 2012/0287967 A1* | 11/2012 | Ogasawara et al. | 375/146 |
| 2013/0127501 A1* | 5/2013 | Chen et al. | 327/115 |
| 2014/0015578 A1* | 1/2014 | Gebre-Selassie et al. | 327/157 |

* cited by examiner

APPARATUS AND METHOD FOR PERFORMING SPREAD-SPECTRUM CLOCK CONTROL

FIELD

One or more embodiments described herein relate to processing signals.

BACKGROUND

Clock circuits are used to synchronize or control the performance of various functions in electronic systems. These systems include but are not limited to mobile devices that perform wireless communications over a variety of channels. In a typical wireless device, display clocks, peripheral component clocks, memory clocks, and central processing unit (CPU) clocks can generate interference that diminishes the efficiency of platform wireless connections.

The main source of interference comes from harmonics of these clocks. These harmonics can overlap the frequency range of one or more wireless (radio) channels. This overlap may significantly reduce the data rate and/or operating range of the channel, thereby diminishing communication quality or limiting device capability.

Many such clocks use a technique called spread spectrum clocking (SSC) in order to reduce the energy levels of clock harmonics and comply with regulatory limits on electromagnetic emissions. However, this technique often increases interference with wireless receivers in the same system by spreading the harmonic energy into radio channels.

DETAILED DESCRIPTION

Figure 1:
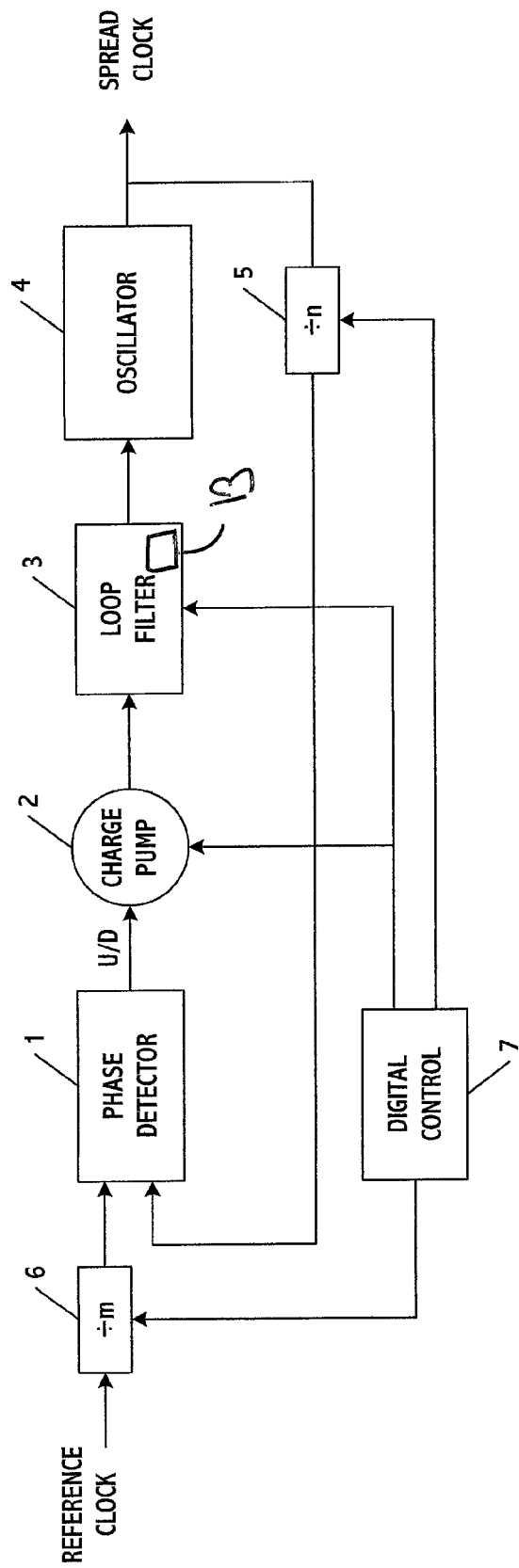
FIG. 1 shows an apparatus for generating spread-spectrum clock signals.

FIG. 1 shows one embodiment of an apparatus for controlling the generation of spread-spectrum clock (SSC) signals in an electronic system. The electronic system may include, for example, any one of a number of mobile terminals such as a smart phone, wireless phone, personal digital assistant, pad terminal, pod-type terminal, navigation system, laptop or notebook computer, as well as others. The system may also be stationary or transportable such as but not limited to a desktop computer or other type of embedded processing apparatus.

The spread-spectrum clock signals may be generated to allow clocks to remain viable for use while at the same time reducing interference in the radio channel by at least a predetermined amount. The SSC clocking signals are generated by controlling one or more parameters of a phase-locked loop (PLL) included in the apparatus.

In accordance with the embodiment of FIG. 1, the apparatus includes a phase-locked loop (PLL) circuit having a phase detector 1, a charge pump 2, a loop filter 3, an oscillator 4, and two divider circuits. The first divider circuit 5 divides the spread clock signal output from the VCO by a predetermined value n. The divided clock signal is sent along a feedback path to one of two inputs of the phase detector. The second divider circuit 6 divided a reference clock signal by a predetermined value m, which may or may not be the same a value n. The divided reference clock signal is input into the other input of the phase detector.

The phase detector compares the phase and/or frequency of the divided clock signal and divided reference signal and generates a difference signal for input into the charge pump. The difference signal may be an up signal or a down signal, or another type of signal indicative of the difference between the divided clock and reference signals.

The charge pump may source current to or sink current from the low-pass filter based on the difference signal from the phase detector. For example, if the divided clock signal is less than the divided reference signal, the charge pump may source current to the low-pass filter. Conversely, if the divided clock signal is greater than the divided reference signal, the charge pump may sink current from the low-pass filter.

The loop filter may be, for example, a low-pass filter made from a capacitor coupled in parallel with a resistor. FIG. 1 shows a capacitor 13 in the loop filter. When the low-pass filter receives source current from the charge pump, the voltage of the capacitor is charged. When current is sourced from the capacitor of the low-pass filter, capacitor voltage decreases. The charging or discharging of the capacitor generates a control signal for controlling the VCO. Also, the capacitor and resistor of the low-pass filter form a low-pass filter which may remove spurious components from the VCO control signal. In other embodiments, a band-pass, high-pass, or other type of filter may be used.

The oscillator may be, for example, a voltage-controlled oscillator which outputs a clock signal based on the control signal output from the low-pass filter. Depending on whether the output of the phase detector was an up or down signal, the VCO increases or decreases the frequency of the clock signal. The comparison performed by the phase detector continues until the two input signals are equal in frequency, thereby producing a stable clock signal output set to a desired channel/frequency. In other embodiments, an oscillator different from a VCO may be used.

The clock signal output from the VCO may correspond to or serve as a basis for generating a spread-spectrum clock signal to synchronize or control functions of the host system. According to one embodiment, the clock signal frequency may be expressed as: $F_{out}=(n/m)\cdot F_{ref}$.

In order to implement spread spectrum clocking based on the clock signal output from the PLL, digital control logic 7 adjusts one or more parameters of the PLL based on, for example, a required mode of operation at a time during the course of operation of the host system. In accordance with one embodiment, the parameters to be adjusted for each mode may be determined based on control information stored in a spread profile storage 8, which may be located within or coupled to control logic 7. The profile storage may be a memory, a set of registers, a logic machine, or any other implementation.

Figure 2:
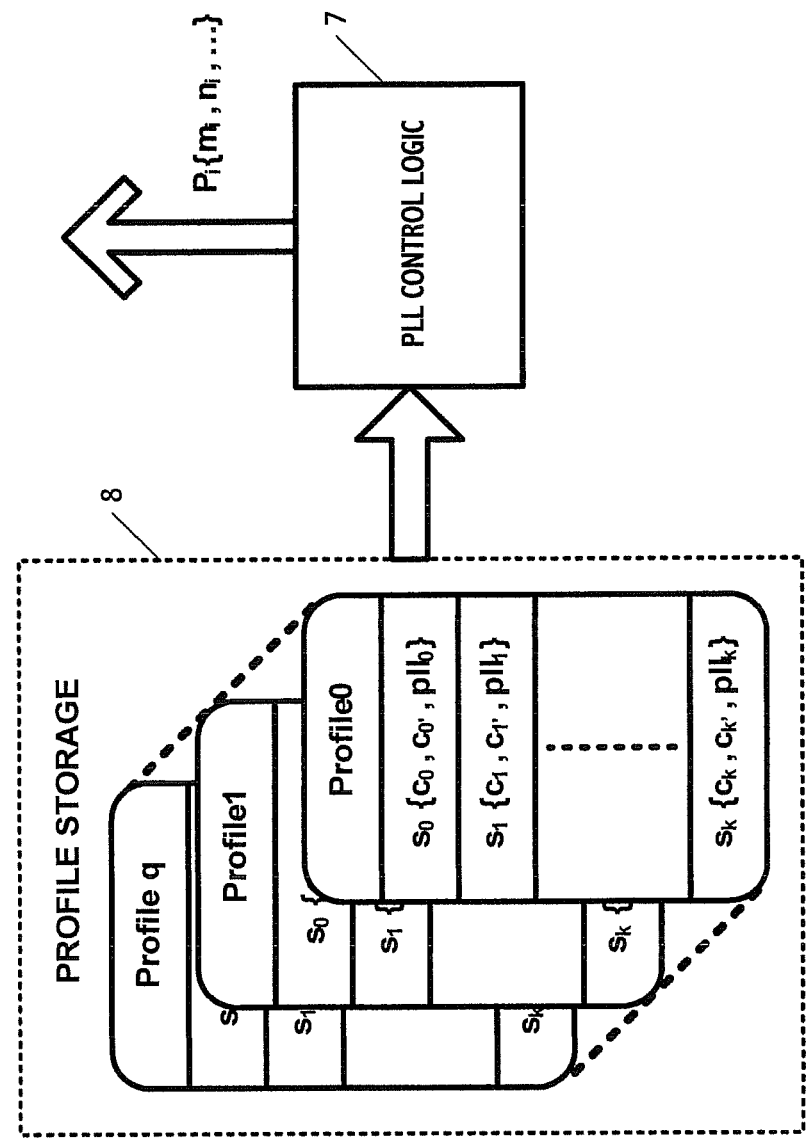
FIG. 2 shows control information for generating spread-spectrum clock signals in different modes of operation.

FIG. 2 shows an example of the control information stored in profile storage for controlling one or more parameters of the PLL. The control information may include a plurality of sets of parameters, each for controlling operation of the PLL (and thus generation of spread-spectrum clocking) for a respective one of a plurality of modes of operation of the host system. In FIG. 2, the sets of parameters are conceptually shown as different profiles, where profile 0 defines a set of PLL parameters for different states in the initial operational mode of the system, profile 1 defines a set of PLL parameters for different states in the next operational mode, and so on.

The number of profiles may be equal to or different from the modes, taking into account that different parameters settings may be required for the PLL within any given mode of operation. Additionally, or alternatively, the profiles may be used to control the PLL clock for different platforms in the host device. For example, when the host system is a mobile terminal, the PLL may be used to generate different spread-spectrum clocking for different platforms. This may prove to be especially useful for certain system-on-chip (SOC) applications.

Also, the parameters to be set or otherwise adjusted by the profiles may be the same or different from state-to-state, from mode-to-mode, and/or from platform-to-platform. For illustrative purposes, one or more of the divider values and/or one or more of the charge pump settings may be set or otherwise adjusted from state-to-state and/or from mode-to-mode.

Referring again to FIG. 2, profile 0 defines the parameters for the PLL for the initial mode of operation having k states $s0, s1, \ldots sk$. In accordance with one embodiment, each state may set three parameters, namely the clock cycles required to transition to the next state along one direction of the spread, the clock cycles required to transition to the next state along the opposite direction of the spread, and a set of PLL parameters. These are shown as $c_i$, $c_i'$, and $pll_i$, for the ith state, $s_i$. The PLL parameters, $pll_i$ may be, but are not limited to the n value of divider 5, and the m value of divider 6, and setting(s) corresponding to the operation of the charge pump. The same mechanism can be implemented in another fashion for a digital PLL.

The remaining states s1 to sk in the first mode of operation have settings for these parameters which may all be different or some of these parameters may be the same, depending on the specific state, for the same spread profile. The remaining profiles may have the same or different numbers of parameters for other operational modes of the host system, to be used to control the PLL for a different spread profile. The digital control logic 7 generates a set of PLL control parameters Pi, based on the input from the profile storage, $c_i$, $c_i'$, and $pll_i$. The control parameters set Pi is sent to the PLL. These PLL control parameters, Pi may be, but not limited to setting (s) corresponding to the divider value(s), the charge pump current, or the loop filter capacitance. For other types of PLLs such as a digital PLL, different PLL parameters, Pi may be generated by the digital control logic. The control logic may implemented by a digital state machine or other type of control.

Figure 3:
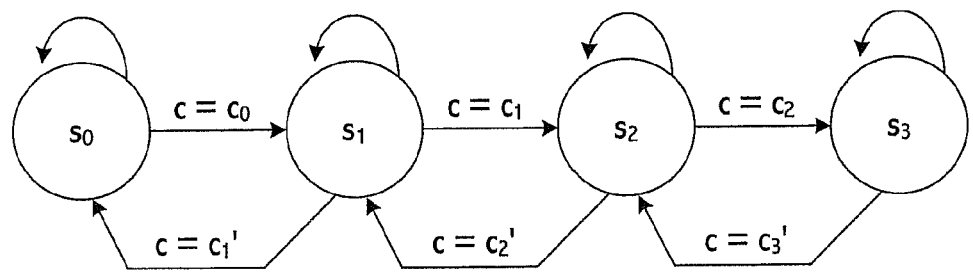
FIG. 3 shows the progression of states in one operational mode example.
Figure 4:
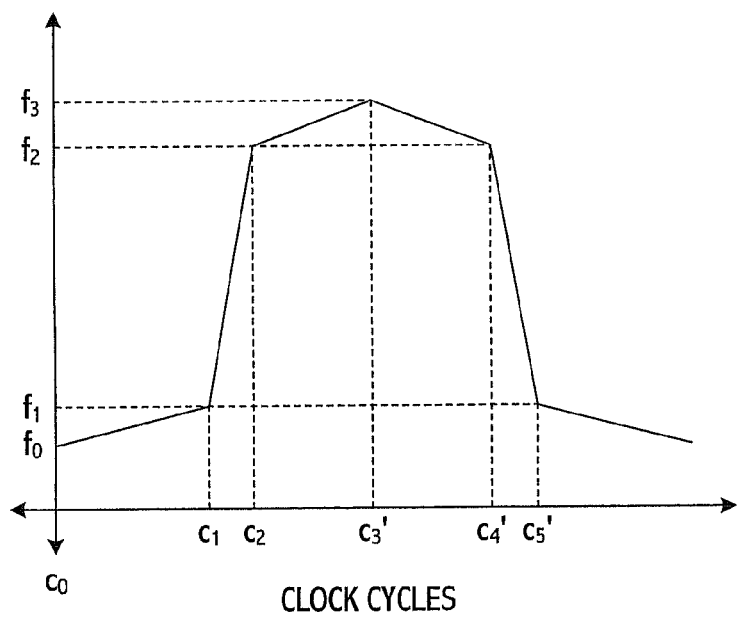
FIG. 4 shows clock signals frequencies for the states in the mode of FIG. 3.

FIG. 3 shows an example of a state diagram for one operational mode of the host system, where parameter k=3 for one of the profiles shown in FIG. 2. Given this parameter, the state diagram will have four states (s0 to s3) with parameters stored in a corresponding profile in profile storage. The digital control logic is responsible for shifting from one state to the next state. The four states are sequentially executed over a time period and the sequence is iterated. FIG. 4 shows the clock signal frequency over this time period.

Referring to FIGS. 3 and 4, in the s0 state, the control logic 7 may set the PLL parameters to values P0 for an initial state s0. These parameters cause the output clock signal of the PLL to be set to a frequency f0.

When the host system transitions from s0 to state s1, the divider and charge pump parameters are set to cause the PLL clock signal to be set to a frequency f1. The frequency transition from f0 to f1 may be substantially linear according to one example. However, in other embodiments, this transition may follow a predetermined curvature or may otherwise be non-linear. The state machine will perform the transition from state s1 to s2 after c1 clock cycles, or from state s1 to s0 or c1' clock cycles depending on the direction of the spread.

When the host system transitions from s1 to state s2, the divider and charge pump parameters are set to cause the PLL clock signal to be set to a frequency f2. The transition from state s1 to s2 takes place relatively quickly. This, in turn, causes the output change in frequency output of the PLL to be proportionally fast, thereby allowing spread-spectrum clocking to have a faster response time compared with many other techniques for controlling spread-spectrum clocking. This may have the effect of improving performance and/or reducing interference in a manner to be described in greater detail.

When the host system transitions from s1 to state s3, the divider and charge pump parameters are set to cause the PLL clock signal to be set to a frequency f3. The transition from state s2 to s3, therefore, may take place more slowly compared with the transition from state s1 to s2, and hence the transition between f2 and f3 may be slower than that between f1 and f2.

In this example, subsequent state transitions from s3 to s0 produce frequency-to-frequency changes at least substantially in a mirror image of the frequency changes that took place from state s0 to s3. Of course, in other embodiments, different state transmissions may be performed for different state and/or frequency transitions, and/or different profiles may be used for different operational modes, of the host system. A specific explanation of how the charge pump parameter is controlled to adjust the clock signal output of the PLL will now be given.

Figure 5:
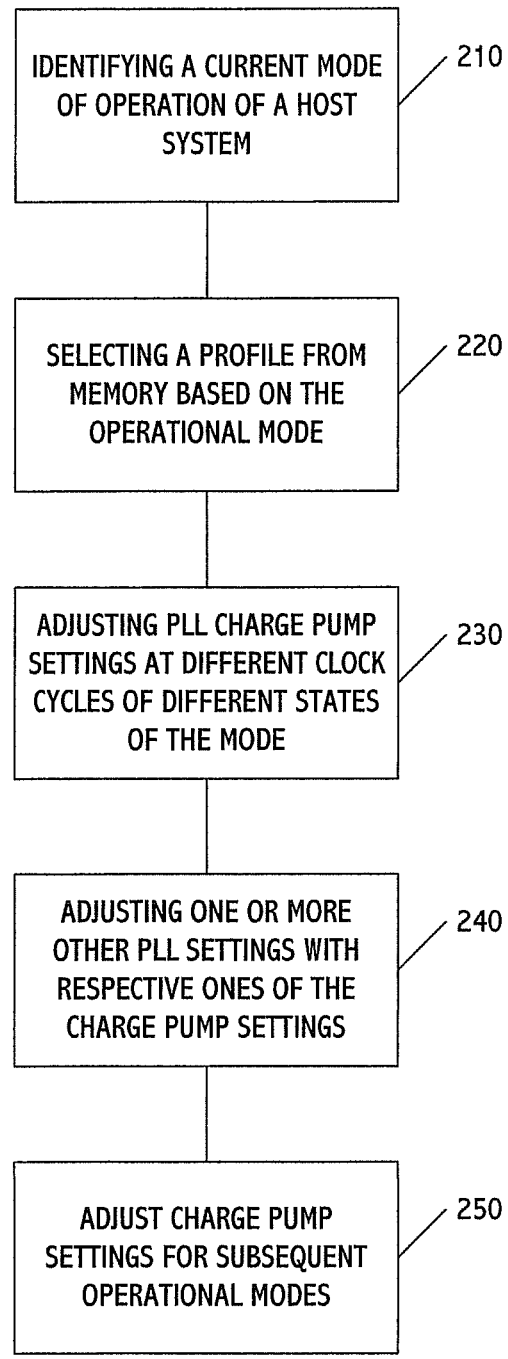
FIG. 5 shows one embodiment of a method for controlling spread-spectrum clocking.

FIG. 5 shows one embodiment of a method for controlling the generation of a spread-spectrum clocking signal. This method may be performed by the circuit of FIG. 2 based on the profiles and parameters in FIGS. 3 and 4, or may be performed by another circuit and/or another set of profiles or parameters. In this embodiment, the slew rate of the VCO (which produces the clock signal) is controlled by using profiles that change the charge pump setting to achieve an increase in the open-loop VCO slew rate. Controlling the charge pump as a way of controlling the rate of change of spread-spectrum clocking may, in some applications, produce a faster response time, thereby leading to improved performance.

An initial operation includes identifying a current mode of operation of a host system. (Block 210). The operational mode, of course, depends on the system. For example, if the system is a mobile terminal such as a smart phone, the operational mode may be performing a voice call, transmitting a text message, or accessing the internet. In any one of these modes, different states of operation are required in order to support different operations of the phone, e.g., transmitter-receiver use, call connection processing, various paging functions, etc.

Once the operational mode has been identified, a controller or processor of the system may select from a storage area a profile corresponding to the operational mode. (Block 220). This controller or processor may, for example, correspond to digital logic 7 and the storage area may correspond to profile storage 8. As illustratively shown in FIG. 2, the profile storage may store a plurality of profiles, each assigned to control operation of a spread-spectrum clock for a corresponding operational mode.

Also, as shown in FIG. 2, each profile may include values for one or more parameters for controlling the PLL. In accordance with the present embodiment, the profile corresponding to the current operational mode makes the control logic to create different charge pump settings for at least two of a plurality of states within that mode. For example, in the illustrative case where k=3 and the selected profile is profile 1 in FIG. 2, four different values of charge pump settings P0 to P3 may be included for four corresponding states of operation s0 to s3 in this mode. Also, as controlled by by this profile, the charge pump settings change over a time period that includes corresponding clock cycles indicated by parameters c and c' in the profile.

Once the profile has been selected, the controller or processor (e.g., control logic 7) may adjust the charge pump settings at times corresponding to the designated clock cycles in the profile and at the different states corresponding to these clock cycles. (Block 230). In the case where k=0, only one charge pump setting may be applied for one state that corresponds to one frequency. In other cases where k>1, various charge pump settings may be applied as previously explained.

By controlling the charge pump to, in turn, control changes in spread-spectrum clocking, a faster and more efficient adjustments in clock signal frequency may be affected. This is evident from the FIG. 4, where in this illustrative non-limiting case the change between PLL output frequencies f1 and f2 takes place quickly (between s1 and s2) according to a steep-sloped (e.g., fast slew rate) transitional line. This is in contrast with other approaches for controlling spread-spectrum clocking which control PLL output frequency according to a much more gradual sloped transition, which, in turn, allows for a greater amount of channel interference. The quicker response time of the present embodiment may eliminate much of this interference, allowing for much-improved channel signal quality.

The charge pump setting may control the charge pump of the PLL by changing the pump current. In this case, the PLL parameters Pi may provide digital control of a current-steering digital-to-analog converter (DAC) which affects the amplitude of charging or discharging current fed to the loop filter every reference clock cycle.

Concurrently with the operation of Block 230 or before or after this block, additional adjustments may optionally be made. The additional adjustments may involve adjusting one or more other PLL settings with respective ones of the charge pump settings at each state of the current operational mode. (Block 240). The one or more other PLL settings may be values of one or both of dividers 5 and 6 for the VCO clock signal and reference signal, respectively. Under some circumstances, this optional block may provide for even greater control over the slew rate of the VCO output frequency, and thus the spread-spectrum clocking that is to be performed. Like the charge pump settings, the divider values may be controlled by control logic 7, based on the profiles stored in profile storage 8.

After the current operational mode is completed, control may continue based on the stored profiles of subsequent operational modes to be detected. (Block 250). This may involve controlling charge pump settings as explained, with or without the adjustment of other PLL parameters at various states within the subsequent modes. If only one PLL is included in the host system, the control logic may control the PLL settings based on other profiles stored in profile storage for each of a plurality of different system platforms in or for functions to be performed by the system.

Figure 6:
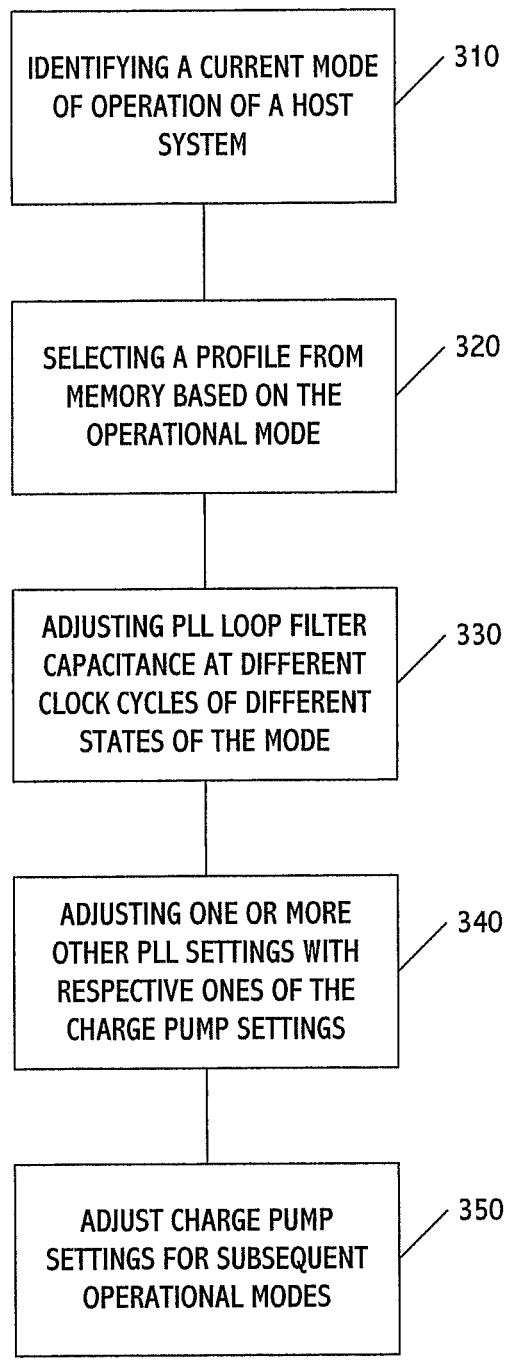
FIG. 6 shows another embodiment of a method for controlling spread-spectrum clocking.

FIG. 6 shows another embodiment of a method for controlling the generation of a spread-spectrum clocking signal. This method is similar to the method of FIG. 5, except that instead of controlling the charge pump settings the loop-filter capacitance is changed in a predetermined manner. In this embodiment, the loop-filter capacitor settings are changed based on values in the profiles stored for respective operational modes and states. Thus, in FIG. 6, Blocks 310, 320, 340 and 350 may be performed in a manner similar to Blocks 210, 220, 240, and 250, but Block 330 is different in that it involves adjusting the PLL loop-filter capacitance.

For example, the loop filter capacitance can be implemented by a minimum valued capacitor having a set of binary-weighted capacitors in parallel, each with an individually controlled switch. When all switches are open, only the minimum valued capacitor is part of the loop filter. This setting could be used for faster VCO frequency changes. When all switches are closed, the loop filter capacitance is maximized which may correspond to PLL operation with conventional spread frequency rates of change.

Like the method of FIG. 5, controlling the loop-filter capacitance from state-to-state and/or from mode-to-mode may serve to increase the slew rate of the VCO compared with other approaches, thereby leading to improved signal quality and/or reduced interference.

Another embodiment corresponds to a method for controlling the generation of a spread-spectrum clocking signal, where both the charge pump setting and loop-filter capacitance are changed in one or more states of operational modes of the host system. In addition, one or more of the divider values and/or other PLL parameters may be changed with the charge pump and loop-filter capacitance settings as a way of further controlling (e.g., increasing or even decreasing, based on the given application) the slew rate of the VCO output frequency.

The parameter (or parameters) adjusted for generating the spread-spectrum clocking signal may be predetermined under various operating conditions for storage in the profiles previously discussed. The parameters may be selected in the profile to reduce a portion of a spectrum corresponding to one or more predetermined channels in a communication band or protocol.

In accordance with one embodiment, the portion of the spectrum to be reduced corresponds to a predetermined portion of a spectrum of the channel that includes noise, and more specifically one or more harmonics of a clocking signal where noise may be resident. For example, at least one parameter to be adjusted may be or affect a slew rate of a voltage-controlled oscillator, e.g., the slew rate may be increased by an amount which reduces noise at one or more harmonics in the spread-spectrum clock signal coincident with one or more frequencies in a range of frequencies allocated to the communications channel.

While this reduction may remove a portion of the clock spectrum itself, a sufficient portion of the unreduced spectrum may remain to allow compliance with electromagnetic emissions regulations, while still providing reduced noise level through adjustment of the slew rate. In other embodiments, a parameter different from slew rate may be adjusted to achieve noise reduction within the frequency range allocated to the channel.

Figure 7:
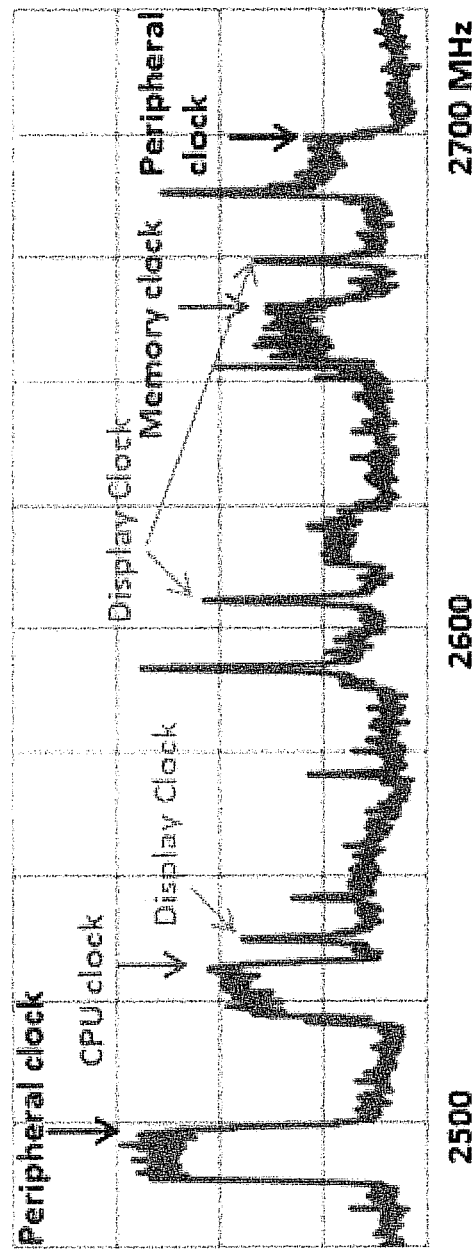
FIG. 7 shows an example of the noise that may exist at various harmonics of a clock signal.

FIG. 7 shows an example of the noise that may exist at various harmonics of a clock signal in a heavily used portion of wireless spectrum. As shown, this noise may be attributed to various factors including but not limited to one or more of peripheral clocks, CPU clocks, pixel clocks, and memory clocks. The noise at these harmonics tends to degrade radio performance. To reduce this noise, a portion of the signal spectrum may be reduced (while other portions may be substantially unaffected) to generate a spectrum having less interference from a clock with essentially the same functionality.

Figure 8:
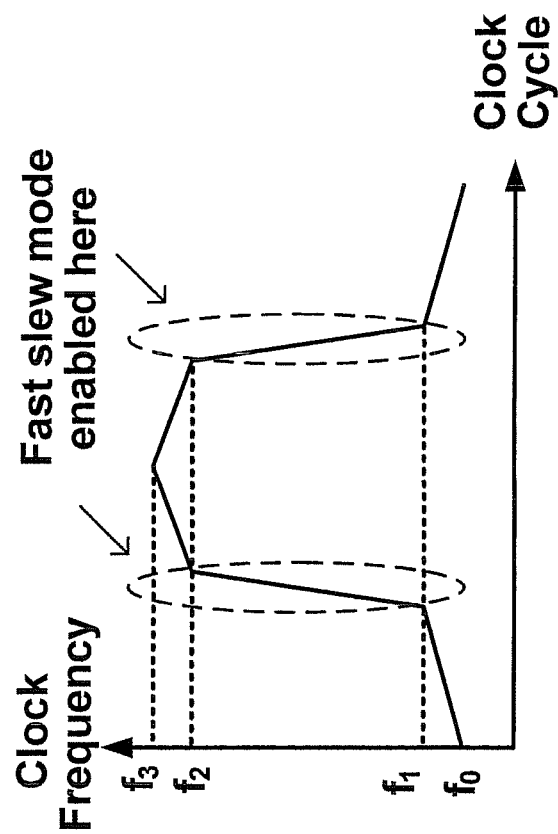
FIG. 8 shows an example of a locking-mode diagram for spread-spectrum clocking.

FIG. 8 shows a locking-mode diagram of how one or more parameters of the phase-locked loop may be controlled by the control logic in accordance with one or more of the aforementioned embodiments, to increase the slew rate of the VCO. In this diagram, the clock cycles are plotted against frequency. Based on adjustments made by the control logic, the PLL locks extremely fast on a proper spread-spectrum clocking signal as evidenced by the substantially vertical slopes in the circled portions of the diagram.

Figure 9:
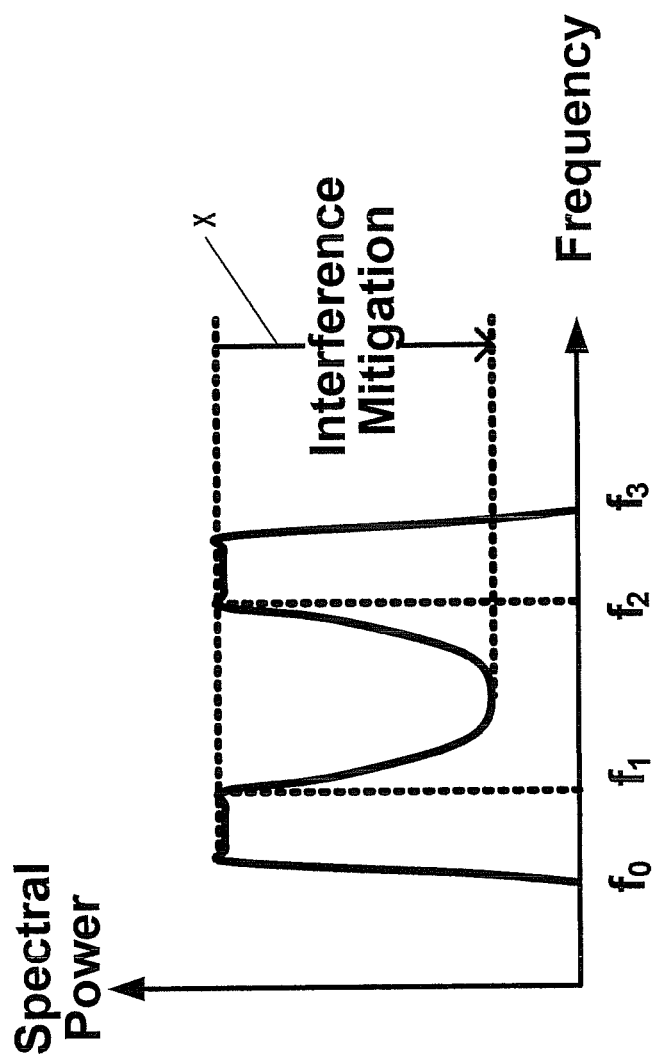
FIG. 9 shows the formation of a notch in the clocking spectrum for a channel produced by the locking-mode diagram of FIG. 8.

The accelerated rate at which locking occurs causes a notch X to form in the range of frequencies allocated to a particular channel as shown in FIG. 9. The arrow in this diagram shows the extent of the spectral energy reduction, which results in a corresponding reduction of clock harmonic noise in this portion of the radio frequency range.

In this example, the extent of the reduction represents the vertical length of the arrow. However, in other embodiments, the adjustments made by the control logic may produce an elimination or near-elimination of the interference energy within the notch. For example, the loop-filter and/or charge pump settings may be controlled, with or without divider-value adjustments, to clear portions of the clock spectrum for radio transmission use in a corresponding channel, while simultaneously reducing noise.

In accordance with another embodiment, a computer-readable medium may store a program including code for implementing any of the aforementioned method embodiments described herein. The computer-readable medium may be a non-transitory medium such as any one of a variety of storage devices or mediums, e.g., internal memory, external storage device, etc. Alternatively, the code of the program may be embedded in a stream or downloadable signal transmitted, for example, over a network.

The program may include first code to determine a mode of an electronic system, second code to receive information from a storage area, and third code to adjust at least one parameter of a phase-locked loop based on the information received from the storage area. One parameter may be at least one of a charge pump setting or a loop-filter capacitance of the phase-locked loop to control spread-spectrum clocking in an electronic system.

In addition, the third code may adjust at least one parameter to cause a slew rate of a voltage-controlled oscillator to increase, the voltage-controlled oscillator to output a signal corresponding to a spread-spectrum clock signal. The slew rate may be increased by an amount which suppresses or eliminates at least one harmonic in the spread-spectrum clock signal at one or more frequencies in a range of frequencies corresponding to a predetermined communications channel.

In accordance with one or more of the aforementioned embodiments, the control logic used to adjust the settings of the PLL may receive a status signal indicating a current operational mode of the host system, the current state within a given mode, and/or the current and the next frequency associated with the states of the mode. Based on this status signal, the control logic may determine what profiles to access for purposes of adjusting the PLL settings.

Alternatively, a profile controller may be provided to cause profile settings to be output from profile storage 8 based on the status signal, so that the control logic may apply these settings to respective portions of the PLL for controlling spread-spectrum clocking. Also, in accordance with one more embodiments, the control logic adjusting the settings of the PLL may be implemented in software, hardware, or both.

One or more embodiments described herein may achieve improved performance compared with other approaches. For example, these embodiments may be implemented without the use of a phase interpolator coupled to the output of the PLL. These interpolators may prove useful in some contexts. However, they have been found to consume power and add to the cost and complexity of the host system. These embodiments may also be implemented with the use of a digital PLL.

Also, one or more embodiments described herein may allow for improved customization of the spread-spectrum clock to various applications, e.g., platforms, operational modes, the states in each mode, etc.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. The features of one embodiment may be combined with the features of one or more other embodiments to form new embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:

1. An apparatus comprising:
a signal output; and
control logic to adjust at least one parameter of a phase-locked loop (PLL) to control spread-spectrum clocking in an electronic system, wherein:
the at least one parameter is a charge pump setting or a loop filter setting of the phase-locked loop,
the control logic is to adjust the parameter by sending a control signal through the signal output coupled to the phase-locked loop,
adjustment of the parameter is to reduce a predetermined portion of a spectrum corresponding to a communications channel, and
the at least one parameter is to be adjusted to cause a slew rate of an oscillator within the PLL to increase.

2. The apparatus of claim 1, wherein the slew rate is to be increased by an amount which reduces at least one harmonic in a spread-spectrum clock signal at one or more frequencies in a range of frequencies corresponding to the communications channel.

3. The apparatus of claim 1, wherein the charge pump setting is to change a rate of sourcing current to or sinking current from a capacitor of a loop filter.

4. The apparatus of claim 3, wherein the charge pump setting is to control a slope of a spread-spectrum clock signal output from the phase-locked loop.

5. The apparatus of claim 4, wherein the slope of the spread-spectrum clock signal is to be controlled to form a notch at one or more frequencies in an energy spectrum corresponding to a communications channel.

6. The apparatus of claim 1, wherein the control logic is to adjust the capacitance of a loop filter of the phase-locked loop.

7. The apparatus of claim 1, wherein the control logic is to receive information corresponding to the charge pump setting or loop-filter capacitance from a profile storage.

8. The apparatus of claim 1, wherein the control logic is to adjust the at least one parameter of the phase-locked loop to a first value for a first operational mode of the electronic system and to a second value different from the first value in a second operational mode of the electronic system.

9. The apparatus of claim 1, wherein the control logic is to adjust the at least one parameter of the phase-locked loop to a first value for a first state and to a second value different from the first value for a second state, and wherein the first and second states correspond to a same operational mode of the electronic system.

10. The apparatus of claim 1, wherein the control logic is to adjust the at least one parameter of the phase-locked loop to a first value for a first time and to a second value different from the first value for a second time, and wherein the first and second times are included in a time period that corresponds to a same operational mode of the electronic system.

11. The apparatus of claim 1, wherein the control logic is a circuit.

12. The apparatus of claim 1, wherein the control logic is to be implemented under control of a program stored in the electronic system.

13. A system comprising:
a memory;
a phase-locked loop (PLL); and
control logic to adjust at least one parameter of the phase-locked loop to control spread-spectrum clocking in an electronic system, wherein the at least one parameter is a charge pump setting or a loop-filter capacitance of the phase-locked loop, wherein the control logic is to adjust the parameter by sending a control signal through a signal output coupled to the phase-locked loop, wherein adjustment of the parameter is to reduce a predetermined portion of a spectrum corresponding to a communications channel, wherein the memory is to store information corresponding to adjustment of the parameter, and wherein the at least one parameter is to be adjusted to cause a slew rate of an oscillator within the PLL to increase, the oscillator to output a signal corresponding to a spread-spectrum clock signal.

14. The system of claim 13, wherein the slew rate is to be increased by an amount which reduces at least one harmonic in the spread-spectrum clock signal at one or more frequencies in a range of frequencies corresponding to the communications channel.

15. The system of claim 13, wherein the charge pump setting is adjusted to control spread-spectrum clocking in the electronic system.

16. The system of claim 15, wherein the charge pump setting changes a rate at which current is sourced to or sinked from a capacitor of the loop filter of the phase-locked loop.

17. The system of claim 16, wherein the charge pump setting controls a slope of a spread-spectrum clock signal output from the phase-locked loop.

18. The system of claim 17, wherein the slope of the spread-spectrum clock signal frequency change is to be controlled to form a notch at one or more frequencies in a spectral waveform corresponding to the communications channel, and wherein the notch corresponds to the predetermined portion of the spectrum of the communications channel.

19. The system of claim 13, wherein the capacitance of a loop filter of the phase-locked loop is adjusted.

20. The system of claim 13, wherein the at least one parameter of the phase-locked loop is adjusted to a first value for a first operational mode and to a second value different from the first value in a second operational mode of the electronic system.

21. The system of claim 13, wherein the at least one parameter of the phase-locked loop is adjusted to a first value for a first state and to a second value different from the first value for a second state, and wherein the first and second states correspond to a same operational mode of the electronic system.

22. A non-transitory computer-readable medium storing a program for processing signals in an electronic system, the program comprising:
first code to receive information from a storage area;
second code to adjust at least one parameter of a phase-locked loop (PLL) based on the information received from the storage area, wherein the at least one parameter is a loop gain or loop filter setting of the phase-locked loop to control spread-spectrum clocking in an electronic system, wherein adjustment of the at least one parameter is to reduce a predetermined portion of a spectrum corresponding to a communications channel, and wherein the second code is to adjust the at least one parameter to cause a slew rate of an oscillator within a PLL to increase, the oscillator to output a signal corresponding to a spread-spectrum clock signal.

23. The medium of claim 22, wherein the slew rate is increased by an amount which suppresses or eliminates at least one harmonic in the spread-spectrum clock signal at one or more frequencies in a range of frequencies corresponding to a predetermined communications channel.

24. The medium of claim 22, wherein:
the at least one parameter of the PLL is a charge pump setting,
adjustment of the charge pump setting by the second code is to control a slope of a spread-spectrum clock signal output from the phase-locked loop, and
control of the slope is to form a notch at one or more frequencies in a spectral waveform corresponding to the communications channel, the notch to correspond to the predetermined portion of the spectrum of the communications channel.

25. A method for processing signals, comprising:
receiving information from a storage area; and
adjusting at least one parameter of a phase-locked loop (PLL) based on the information received from the storage area, wherein the at least one parameter is a loop gain or loop filter setting of the phase-locked loop to control spread-spectrum clocking in an electronic system and wherein the at least one parameter reduces a predetermined portion of a spectrum corresponding to a communications channel, wherein the at least one parameter is adjusted to cause a slew rate of an oscillator within the PLL to increase, the oscillator to output a signal corresponding to a spread-spectrum clock signal.

26. The method of claim 25, wherein the slew rate is increased by an amount which suppresses or eliminates at least one harmonic in the spread-spectrum clock signal at one or more frequencies in a range of frequencies corresponding to a predetermined communications channel.

* * * * *